(12) United States Patent
Yu

(10) Patent No.: US 6,787,402 B1
(45) Date of Patent: Sep. 7, 2004

(54) DOUBLE-GATE VERTICAL MOSFET TRANSISTOR AND FABRICATION METHOD

(75) Inventor: Bin Yu, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 396 days.

(21) Appl. No.: 09/845,604

(22) Filed: Apr. 27, 2001

(51) Int. Cl.[7] .................... H01L 21/355; H01L 21/00
(52) U.S. Cl. ........................................ 438/142; 438/151
(58) Field of Search ........................... 438/142, 157, 438/164, 212, 264, 311, 151, 156, 588; 257/412, 411, 413, 437, E27.112, E21.32, E21.564

(56) References Cited

U.S. PATENT DOCUMENTS

| | | | | |
|---|---|---|---|---|
| 4,996,574 A | * | 2/1991 | Shirasaki | 257/347 |
| 5,382,816 A | * | 1/1995 | Mitsui | 257/265 |
| 5,689,127 A | * | 11/1997 | Chu et al. | 257/135 |
| 6,118,161 A | * | 9/2000 | Chapman et al. | 257/333 |
| 6,252,284 B1 | * | 6/2001 | Muller et al. | 257/411 |

OTHER PUBLICATIONS

Xuejue Huang, Wen–Chin Lee, Charles Kuo, Digh Hisamoto, Leland Chang, Jakub Kedzierski, Erik Anderson, Hideki Takeuchi, Yang–Kyu Choi, Kazuya Asano, Vivek Subramanian, Tsu–Jae King, Jeffrey Bokor and Chenming Hu, "Sub 50–nm FinFET: PMOS", 1999 IEDM, 4 pages.

* cited by examiner

Primary Examiner—George Fourson
Assistant Examiner—Brook Kebede
(74) Attorney, Agent, or Firm—Farjami & Farjami LLP

(57) ABSTRACT

A double-gate vertical MOSFET transistor is described along with an associated fabrication method. The MOSFET transistor is configured with separate gates on each side of a vertical source-drain channel that is capped by an insulation layer. The fabrication process generally comprises forming a silicon-insulator stack having a silicon fin (channel) capped with insulation. The opposing ends of the silicon-insulator stack being configured with areas capable of receiving source and drain contacts. The vertical surfaces of the silicon fin are insulated prior to the formation of gate electrodes adjacent the two opposing sides of the silicon-insulator stack. By way of example, the gate electrodes are formed by depositing a thick layer of conductive gate material over the substrate and then removing the adjoining upper portion, such as by polishing. Portions of each gate electrode are configured with areas capable of receiving a gate contact.

10 Claims, 6 Drawing Sheets

DOUBLE-GATE VERTICAL MOSFET TRANSISTOR AND FABRICATION METHOD

BACKGROUND OF THE INVENTION

1. Field of the Invention

The present invention relates to the fabrication of MOSFET transistors and more particularly to a double-gate MOSFET transistor having separate gate electrodes and the associated fabrication method.

2. Description of the Background Art

As process geometries continue to shrink in the drive toward higher circuit density, the adverse consequences arising from short channel effects become increasingly important. Substantial attention is being directed toward the use of vertical channel MOSFET transistors. It will be appreciated that a MOSFET transistor may be fabricated, such as on an SOI wafer, in a vertical channel configuration, often characterized as a FinFET, by virtue of the vertical fin which defines the source-drain channel. It will be appreciated that FinFET transistors have a potential for use with sub-twenty-five nanometer (<25 nm) gate lengths as they can provide high drive current and high immunity to short-channel effects. However, the conventional fabrication practices utilized for creating these vertical MOSFET transistors only provide for the creation of single gate devices. One such FinFET device recently described is a MOSFET having a single gate structure distributed over opposing sides of the vertical "fin" channel.

The traditional use of single gate devices limits the gate biasing alternatives available for the associated device. A single gate device obviously requires that threshold voltage be controlled by utilizing a single gate control voltage. It will be appreciated, however, that a number of applications exist in which the use of more than one control voltage can provide a number of benefits.

Therefore, a need exists for a double-gate vertical MOSFET transistor having a pair of separate gates. The present invention satisfies that need, as well as others, and overcomes deficiencies of previously developed solutions.

BRIEF SUMMARY OF THE INVENTION

The present invention describes a double-gate vertical MOSFET transistor having separate gates and an associated method for fabricating the transistor. The vertical MOSFET is configured with a vertical channel extending from an insulated substrate, such as the insulator layer of an SOI wafer. The sidewalls of the vertical channel are insulated from the adjacent gates with a thin layer of gate insulation, while a thicker capping layer of insulation is provided over the top of the vertical channel. Separate gate electrodes are formed on each side of the vertical channel adjacent to the insulation on the sidewalls of the vertical channel. The conduction-state of the resultant vertical double-gate transistor is thereby responsive to the combination of applied gate voltages on either side of the vertical channel. It will be appreciated that the use of a double-gate device can simplify transistor biasing and be utilized in applications that do not lend themselves to the use of a single gate.

By way of example, the double-gate vertical MOSFET transistor of the present invention is generally fabricated according to the following steps. A layer of insulation, such as silicon nitride ($Si_3N_4$) is deposited over a thin silicon layer. The insulation and silicon layer are patterned to form a silicon-insulator stack having a silicon fin capped with insulation having opposing ends which are configured for receiving source and drain contacts. The channel preferably remains undoped having a threshold voltage of determined solely by the gate work function. The vertical surfaces of the silicon fin are insulated, such as by the formation of gate oxide, to isolate the vertical channel from subsequently created gates. Separate gate electrodes are then formed on opposing sides of the insulated silicon-insulator stack. Preferably, the separate electrodes are formed by depositing a thick layer of gate electrode material over the substrate and then polishing the electrode material until the insulator cap of the silicon-insulator stack protrudes through, and electrically separates, the electrode material into a gate "A" and a gate "B" The separate gate areas are then patterned to provide the desired gate width along the side of the silicon-insulator stack and to configure each electrode with areas for receiving a contact. Conventional process steps may thereafter be utilized to form the contacts and complete the fabrication of the double-gate vertical MOSFET transistor.

An object of the invention is to create a double-gate vertical MOSFET transistor having separate gate electrodes.

Another object of the invention is to provide a fabrication method for a double-gate vertical MOSFET transistor.

Another object of the invention is to provide a double-gate vertical MOSFET transistor fabrication process that can be implemented on an SOI substrate.

Another object of the invention is to provide a double-gate vertical MOSFET transistor fabrication process in which an insulation capping layer is utilized above the vertical channel for separating the two separate gates of the device.

Another object of the invention is to provide a double-gate vertical MOSFET transistor fabrication process in which separate electrodes are formed by depositing gate electrode material over the substrate and polishing until the insulation layer protrudes.

Another object of the invention is to provide a double-gate vertical MOSFET transistor fabrication process that can utilize conventional semiconductor processing equipment.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Referring more specifically to the drawings, for illustrative purposes the present invention is embodied in the apparatus generally shown in FIG. 1 through FIG. 6. It will be appreciated that the apparatus may vary as to configuration and as to details of the parts, and that the method may vary as to the specific steps and sequence, without departing from the basic concepts as disclosed herein.

Figure 1:
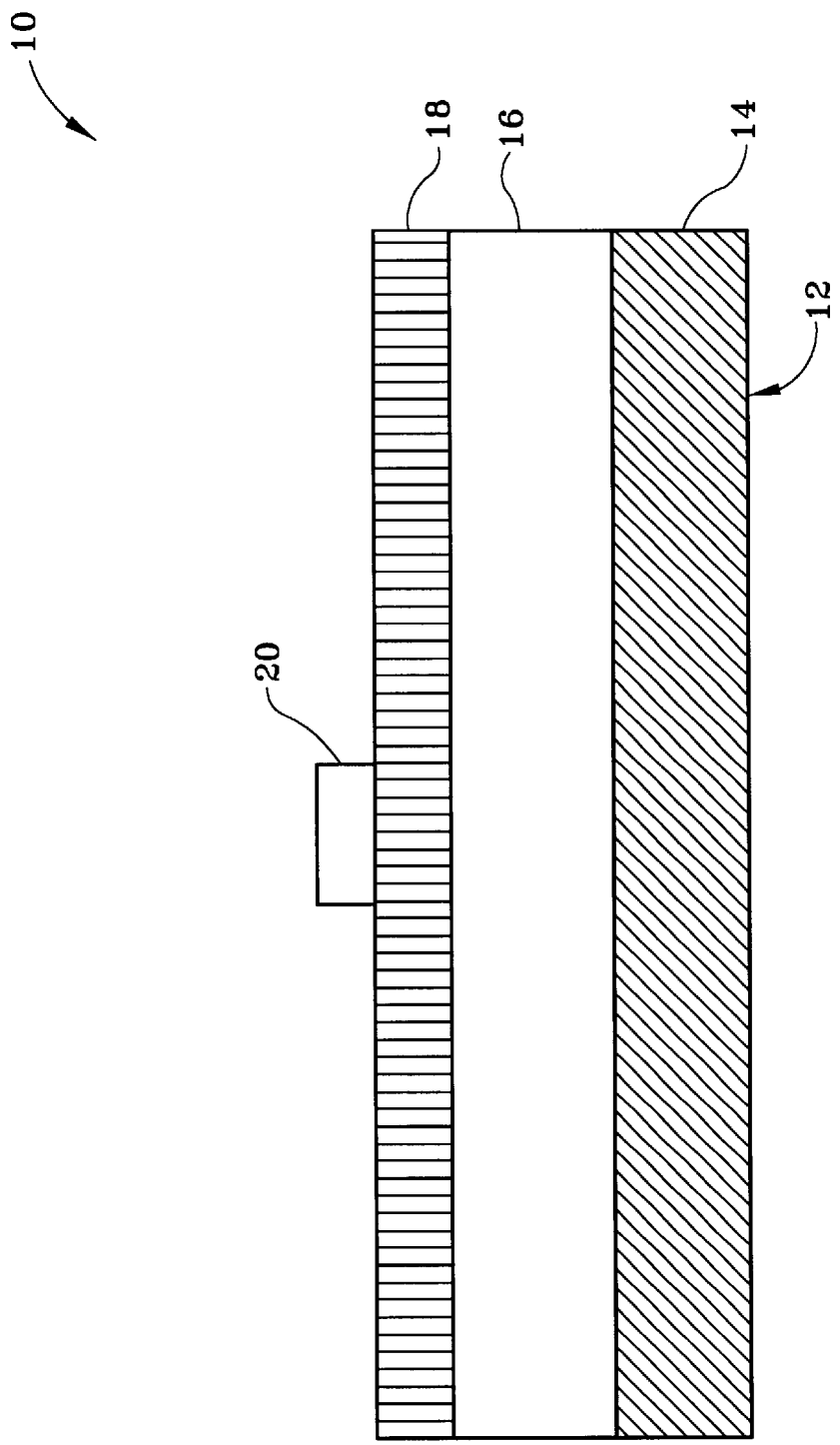
FIG. 1 is a schematic view of double-gate vertical MOSFET transistor formation on an SOI substrate according to an aspect of the present invention, showing mask placement over a deposited layer of insulation.
Figure 2:
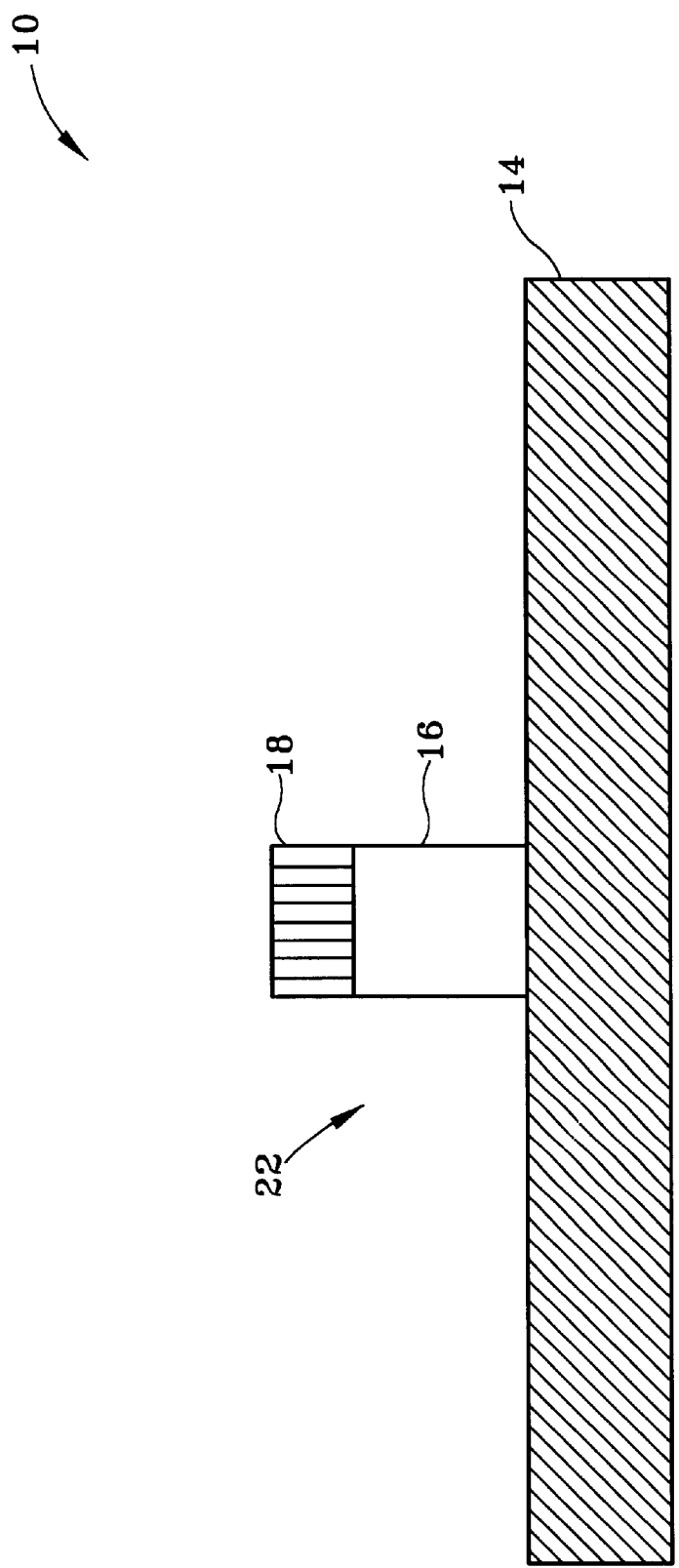
FIG. 2 is a schematic view of the double-gate vertical MOSFET transistor of FIG. 1, shown with a channel stack capped with insulation.
Figure 3:
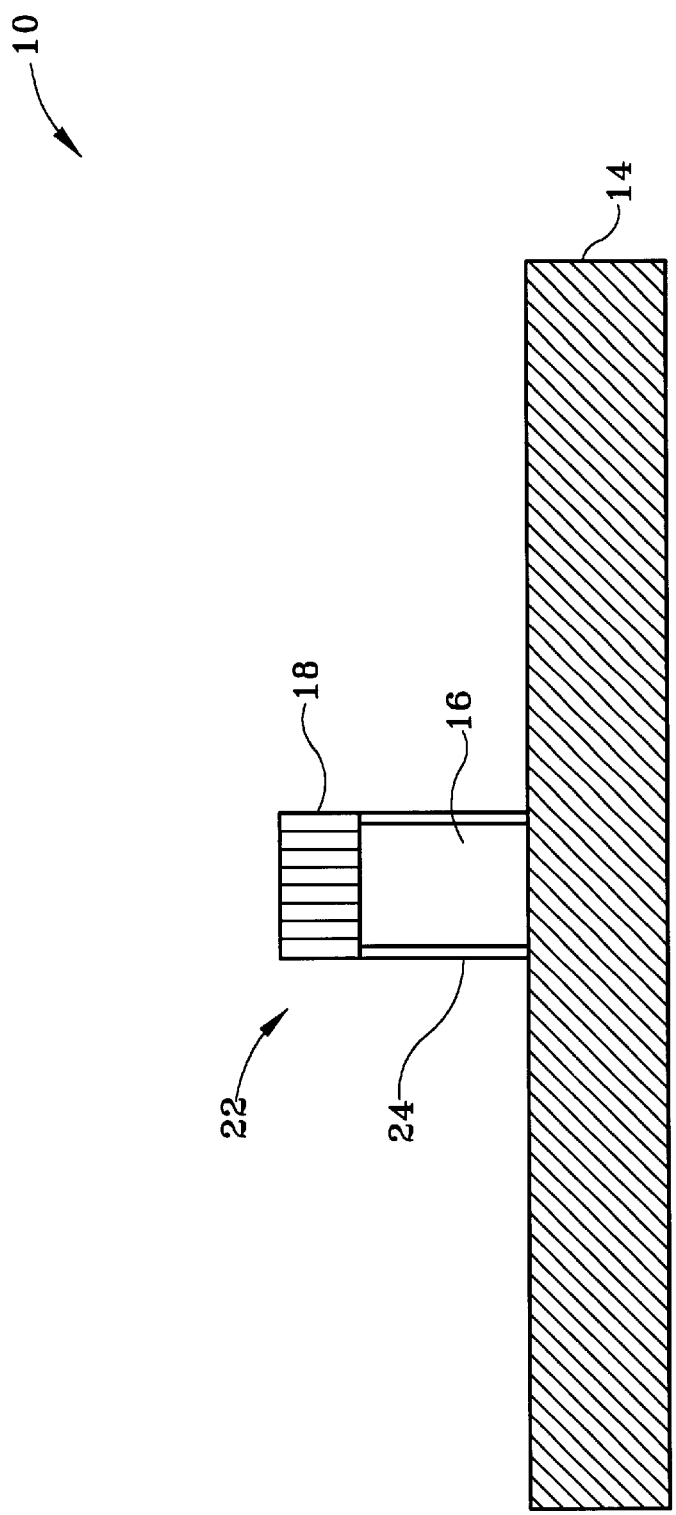
FIG. 3 is a schematic view of the double-gate vertical MOSFET transistor of FIG. 2, shown after deposition of a thin gate oxide layer.
Figure 4:
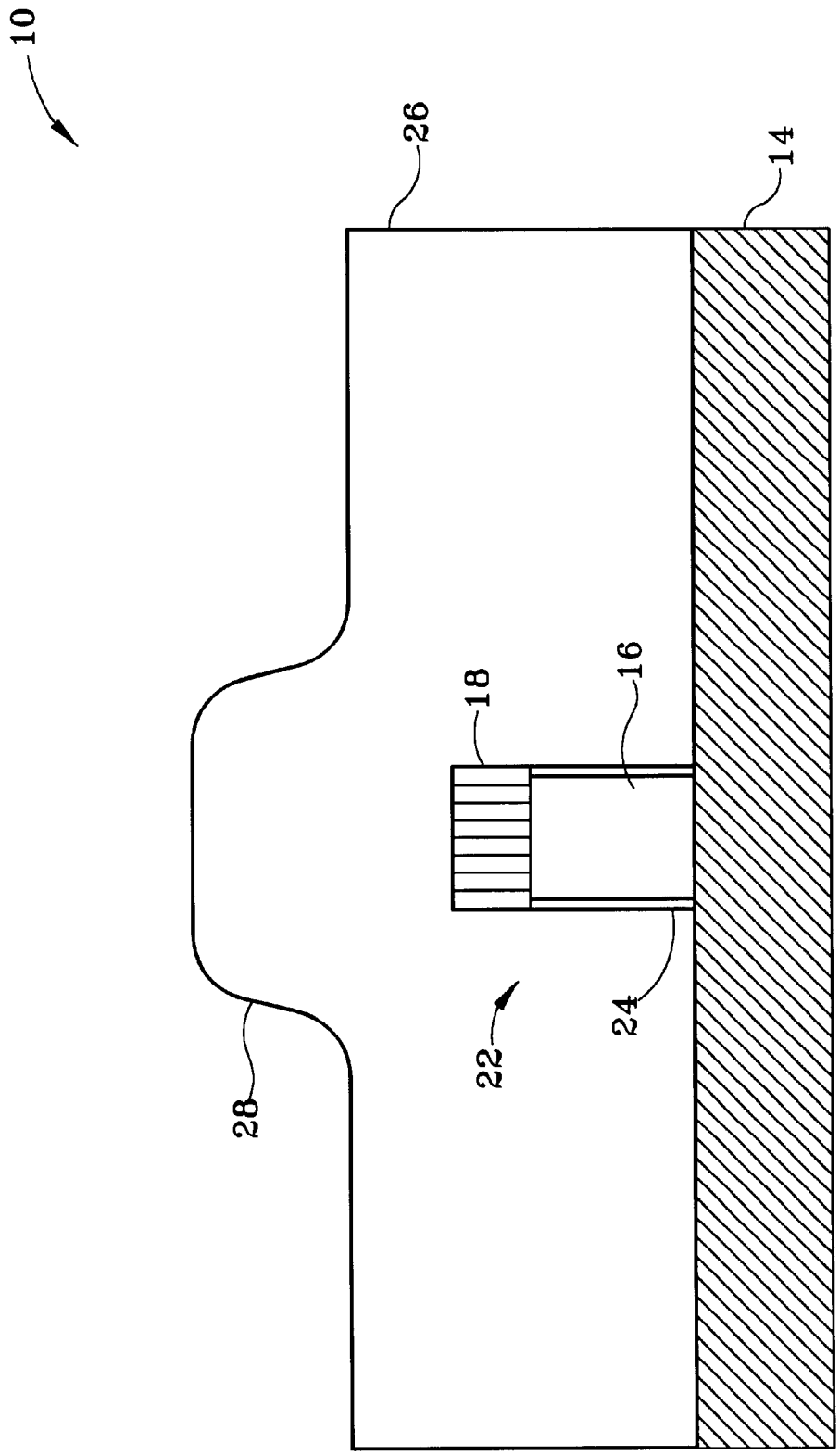
FIG. 4 is a schematic view of the double-gate vertical MOSFET transistor of FIG. 3, shown after deposition of a thick layer of gate electrode material.
Figure 5:
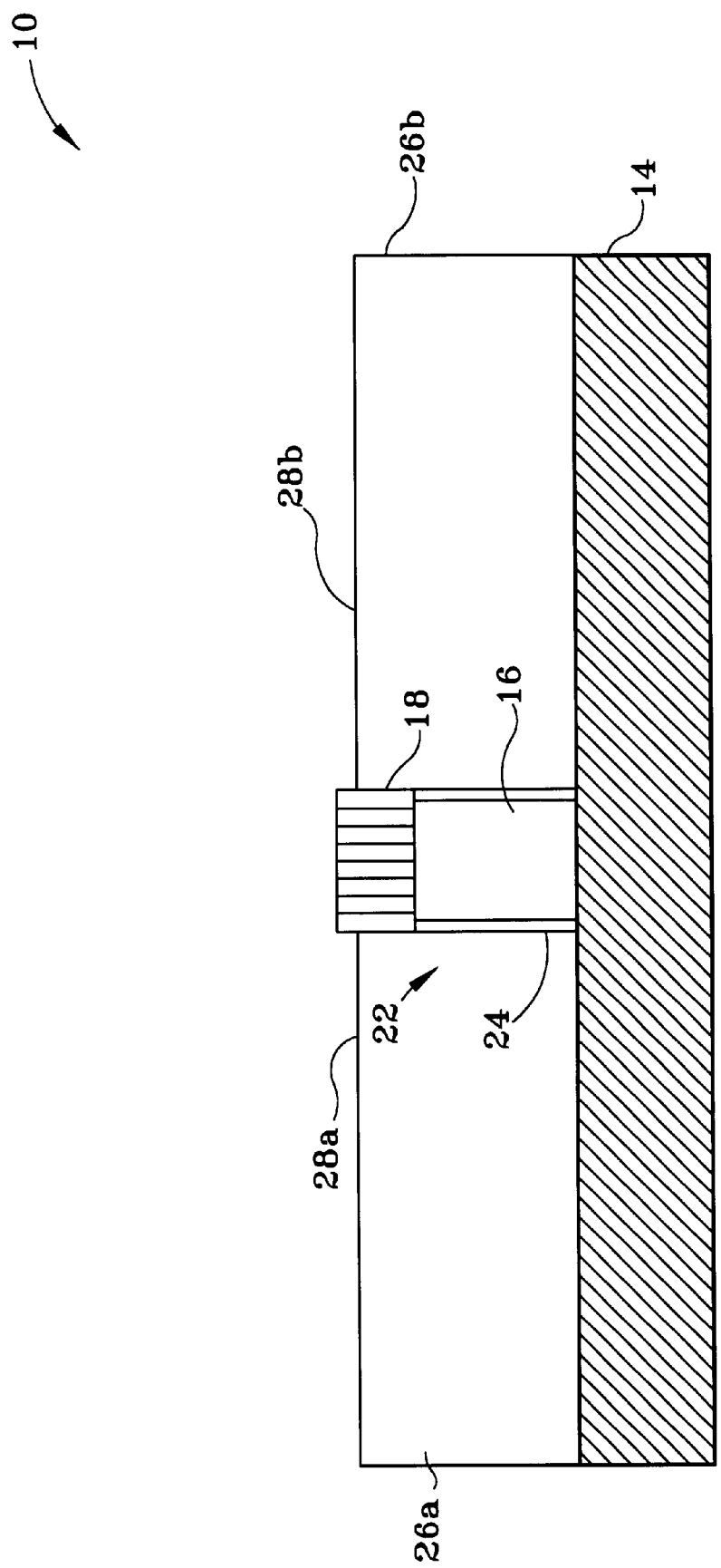
FIG. 5 is a schematic view of the double-gate vertical MOSFET transistor of FIG. 4, shown after removal of the excess gate material above the channel.

A vertical channel double-gate MOSFET device and method of fabrication is exemplified according to the present invention as depicted in the schematic sequence shown in FIG. 1 through FIG. 6. Referring first to FIG. 1, the vertical double-gate MOSFET transistor 10 is shown being fabricated on a substrate 12 portion of a silicon-on-insulator (SOI) wafer. An SOI wafer typically comprises an insulator 14 overlayed with a thin silicon layer 16. MOSFET fabrication according to the invention starts by deposition of a layer of silicon nitride ($Si_3N_4$) 18 and a photo-resist 20 over the silicon layer 16 of the SOI wafer. Subsequent to etching of silicon layer 16 and insulator layer 18, a vertical channel is created as shown in FIG. 2 which comprises a silicon layer 16 capped with a segment of insulation layer 18, the combination of segments referred to as a silicon-insulator stack 22. The approximate height of the silicon-insulator stack is preferably in range of from eight hundred Angstroms to fifteen hundred Angstroms (800 Å–1500 Å). Referring now to FIG. 3, the vertical segment of silicon layer 16 forming the vertical source-drain channel is insulated to accommodate the subsequent formation of gate electrodes. Insulating the silicon of the channel may be performed by a variety of processes, for example by the formation of gate oxide 24 on the sidewalls of vertical segment of silicon layer 16. After insulating the channel, a thick layer of gate material 26 is deposited over the substrate 12 to create the "buried-stack" structure depicted in FIG. 4. The gate material 26 is preferably deposited over the substrate to a thickness which assures covering the silicon-insulator stack 22, such as a layer having a depth of from between three thousand Angstroms and six thousand Angstroms (3000 Å–6000 Å). Any of various substantially conductive materials may be utilized for the deposited gate electrode material 26, such as poly-Si, poly-SiGe, metal, and so forth. The gate material is preferably deposited such that top surface 28 of gate material 26 covers silicon-insulator stack 22. Removal of the excess gate material 26 above the remaining segment of insulation 18, results in the structure of FIG. 5. The excess gate material 26 is preferably removed in a chemical-mechanical polishing process that utilizes insulation layer 18 as a polishing stopper. It will be appreciated that the conductive gate material is thereby divided into two sections of gate material 26a, 26b separated by the silicon-insulator stack 22. Furthermore, the two respective gates are insulated from the channel by gate insulator 24. It will be appreciated that the surface of the gate material 28a, 28b, is now broken into two sections by the protruding segment of insulation layer 18 within the silicon-insulator stack 22. The gate material is then patterned (not shown) to create a predetermined gate width and to provide for gate contact regions.

Figure 6:
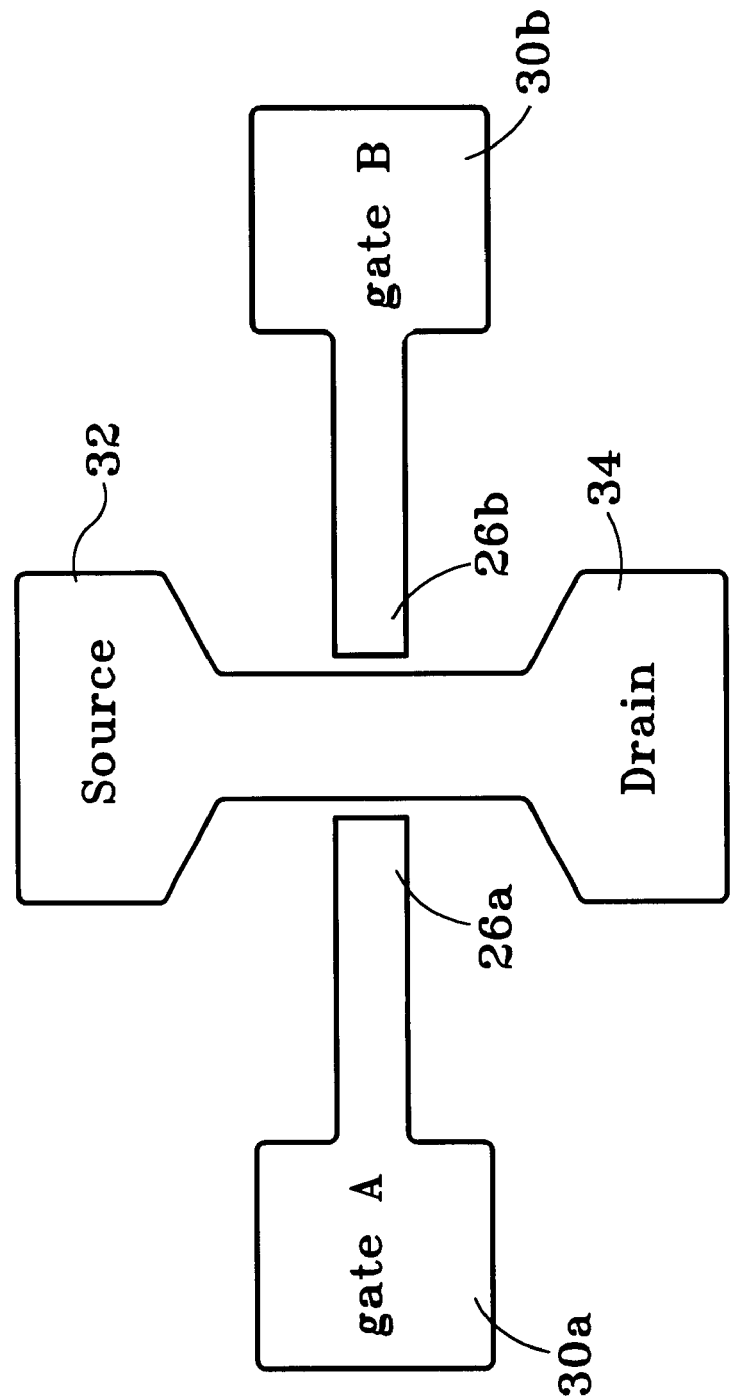
FIG. 6 is a top schematic view of the double-gate vertical MOSFET transistor according to an aspect of the present invention, showing gate "A" and gate "B" separated by the vertical source-drain channel.

Referring now to FIG. 6, a top view of the structure for the double-gate MOSFET 10 is shown with gate "A" 26a having a contact region 30a, and gate "B" 26b having a contact region 30b. The two gates are separated by the silicon-insulator stack 22 comprising the vertical channel which expands out into respective source 32 and drain 34 contact areas.

Individual bias voltages may be applied to each gate of the depicted vertical MOSFET transistor wherein the threshold voltage of the device may be controlled by the combination of applied voltages. Furthermore, the use of dual-gate biasing of the transistor provides the possibility to reduce the standby power and to improve the on-state drive current through a dynamic threshold voltage design.

Accordingly, it will be seen that this invention provides a double-gate vertical MOSFET transistor having separate gates and a method of fabrication. Devices fabricated according to the present invention can provide improved control of device threshold voltage with simplified biasing. It will be appreciated that the invention may be practiced utilizing an assortment of materials in a range of process geometries without departing from the teachings of the present invention. Furthermore, it will be appreciated that the inventive method can be generally practiced to fabricate double-gate vertical MOSFET devices having separate gates "A" and "B" on a number of substrates.

Although the description above contains many specificities, these should not be construed as limiting the scope of the invention but as merely providing illustrations of some of the presently preferred embodiments of this invention. Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. A method of fabricating a double-gate vertical channel MOSFET, having separate gates, on a substrate, comprising:

forming a silicon-insulator stack wherein a silicon fin is capped with insulation;

insulating the vertical surfaces of the silicon fin;

forming separate Rate electrodes on opposing sides of the silicon fin, wherein conventional process steps may be thereafter utilized to form the contacts and complete fabrication of the double-gate vertical MOSFET transistor;

wherein the process of forming separate gate electrodes is performed by depositing a substantially conductive gate material over the substrate followed by the removal of the upper portion of the conductive material until the insulation cap of the silicon-insulator stack protrudes through the conductive material.

2. A method as recited in claim 1, wherein the opposing ends of each gate electrode are configured during the gate electrode forming process with areas capable of receiving a gate contact.

3. A method as recited in claim 1, wherein chemical-mechanical polishing is utilized for removing the gate material covering the silicon fin capped with insulation.

4. A method of fabricating a double-gate vertical MOSFET transistor on a SOI substrate, comprising:

depositing a layer of insulation over the SOI substrate;

selective etching to create a fin of silicon capped with insulation;

insulating the vertical walls of the silicon fin;

depositing a gate electrode material to substantially cover the fin; and removing of upper portions of the gate electrode material until the insulation cap is exposed such that the gate electrode material is divided into a first gate and a second gate of the MOSFET transistor separated by the silicon fin and insulation cap, after which conventional processing steps may be utilized to pattern the gate electrodes, form connections, and complete MOSFET transistor fabrication.

5. A method as recited in claim 4, wherein the layer of insulation comprises a silicon nitride material ($S_3N_4$).

6. A method as recited in claim wherein the height of the fin is within the range from 800 Angstroms to 1500 Angstroms.

7. A method as recited in claim 4, wherein the selective etching has been patterned to create source-drain channel regions having ends configured with areas capable of receiving respective source and drain contacts.

8. A method as recited in claim 4, wherein the vertical walls of the silicon fin are insulated by forming a layer of gate oxide on them.

9. A method as recited in claim 4, wherein the gate electrode material is substantially conductive and deposited to a thickness of from 3000 Angstroms to 6000 Angstroms.

10. A method as recited in claim 4, wherein chemical-mechanical polishing is utilized for, removing the gate electrode material covering the silicon fin.

* * * * *